United States Patent
Li et al.

(10) Patent No.: US 7,396,432 B2
(45) Date of Patent: Jul. 8, 2008

(54) COMPOSITE SHADOW RING ASSEMBLED WITH DOWEL PINS AND METHOD OF USING

(75) Inventors: Chang-Jung Li, Hsinchu (TW); Wen-Ming Chen, Miaoli (TW); Kun-Yen Fan, Jubei (TW); Wen-Chi Wang, Chu-Nan (TW)

(73) Assignee: Taiwan Semiconductor Mfg. Co., Ltd, Hsin-Chu (TW)

( * ) Notice: Subject to any disclaimer, the term of this patent is extended or adjusted under 35 U.S.C. 154(b) by 1122 days.

(21) Appl. No.: 10/164,986

(22) Filed: Jun. 7, 2002

(65) Prior Publication Data
US 2003/0226822 A1    Dec. 11, 2003

(51) Int. Cl.
*H01L 21/00* (2006.01)
*C23C 16/00* (2006.01)

(52) U.S. Cl. ............ 156/345.51; 156/915; 156/345.52; 156/345.53; 156/345.54; 118/728; 118/725; 118/724

(58) Field of Classification Search .............. 156/915, 156/345.51, 345.52, 345.53, 345.54; 118/728
See application file for complete search history.

(56) References Cited

U.S. PATENT DOCUMENTS

| | | | | |
|---|---|---|---|---|
| 5,887,733 | A * | 3/1999 | Harvey et al. | 211/182 |
| 6,036,587 | A * | 3/2000 | Tolles et al. | 451/288 |
| 6,088,985 | A * | 7/2000 | Clark | 52/309.11 |
| 6,537,625 | B2 * | 3/2003 | Flach et al. | 428/34.1 |

* cited by examiner

*Primary Examiner*—Ram N Kackar
(74) *Attorney, Agent, or Firm*—Tung & Associates

(57) ABSTRACT

A composite shadow ring that is constructed of an upper ring and a lower ring assembled together by a plurality of dowel pins and a method for using the ring. The upper ring and the lower ring each has a predetermined outside diameter that is substantially the same, a planar top surface and a planer bottom surface parallel to the planar top surface. Each of the planar bottom surface of the upper ring and the planar top surface of the lower ring has at least two blind holes formed therein. A plurality of dowel pins are used to frictionally engage the at least two blind holes in the upper ring and the at least two blind holes in the lower ring.

10 Claims, 2 Drawing Sheets

COMPOSITE SHADOW RING ASSEMBLED WITH DOWEL PINS AND METHOD OF USING

FIELD OF THE INVENTION

The present invention generally relates to a composite shadow ring for use in a plasma etch chamber and a method for using the ring, more particularly, relates to a composite shadow ring for use in a plasma etch chamber that is constructed of an upper ring and a lower ring assembled together with dowel pins and a method for using the composite shadow ring.

BACKGROUND OF THE INVENTION

In the fabrication of modern integrated circuit devices, one of the key requirements is the ability to construct plugs or interconnects in reduced dimensions such that they may be used in a multi-level metalization structure. The numerous processing steps involved require the formation of via holes for the plug or interconnect in a dimension of 0.5 µm or less for high-density logic devices. For instance, in forming tungsten plugs by a chemical vapor deposition method, via holes in such small dimensions must be formed by etching through layers of oxide and spin-on-glass materials at a high etch rate. A high-density plasma etching process utilizing a fluorine chemistry is thus used for such via formation process.

The via hole formation process can be enhanced by improving the etch directionality by a mechanism known as sidewall passivation to improve the anisotropy of the etching process. By utilizing a suitable etchant gas and suitable reactor parameters, an etch-inhibiting film of a polymeric nature can be formed on vertical sidewalls. The etch-inhibiting film slows down or completely stops any possible lateral etching of horizontal surfaces in the via hole. For instance, when a fluorine-containing etchant gas such as $CFH_3$ is used, a fluorine-type polymeric film is formed on the sidewalls. Many photoresist materials may also contribute to the formation of polymeric films on the sidewalls. After the sidewall is coated with a polymeric film, it is protected by the inhibitor film to preserve the line width or via hole diameter control.

In a modern etch chamber, an electrostatic chuck (or E-chuck), is frequently used in which the chuck electrostatically attracts and holds a wafer that is positioned on top. The use of E-chuck is highly desirable in the vacuum handling and processing of wafers. In contrast to a conventional method of holding wafers by mechanical clamping means where only slow movement is allowed during wafer handling, an E-chuck can hold and move wafers with a force equivalent to several tens of Torr pressure. Another advantage for the E-chuck is that no particle generation or contamination problem can occur since there are no moving parts acting on the wafer. Moreover, the electrostatic force utilized on an E-chuck is sufficient in preventing bowing of a wafer which normally occurs in mechanical clamping and thus promotes uniform heat transfer over the entire wafer surface.

In an etch chamber equipped with a plasma generating device and an E-chuck, a shadow ring may be utilized as a seal around the peripheral edge of the wafer. The shadow ring, also known as a focus ring, is utilized for achieving a more uniform plasma distribution over the entire surface of the wafer and for restricting the distribution of the plasma cloud to only the wafer surface area. The uniform distribution function may be further enhanced by a RF bias voltage applied on the wafer during a plasma etching process. Another function served by the shadow ring is sealing at the wafer level the upper compartment of the etch chamber which contains the plasma from the lower compartment of the etch chamber which contains various mechanical components for controlling the E-chuck. This is important since it prevents the plasma from attacking the hardware components contained in the lower compartment of the etch chamber. In order to survive high temperature and hostile environments, a shadow ring is frequently constructed of a ceramic material such as quartz.

In an etch chamber equipped with a high density plasma and an E-chuck, problems sometimes arise in the operation of the E-chuck. High density gas plasma formed has a short debye length and consequently very small sheaths are formed at boundaries of objects that are present in the gas plasma. The debye length is defined as the distance from the plasma at which the electron density drops to 1e/ of the electron density in the bulk plasma. The debye length can be calculated by first dividing the electron temperature by the electron density, and then taking the square root. The typical electron temperature in a high density plasma is low, i.e., on the order of a few eV. On the other hand, the electron density is high, i.e., on the order of $10^{11}$~$10^{12}$ electrons per cubic centimeter. This leads to a small debye length on the order of approximately several tenths of a millimeter. Gaps found in a process chamber that is larger than a few debye length may either cause a gas breakdown or the plasma may be extracted into the sufficiently large gaps.

In order to prevent the plasma from affecting the voltage on the electrode of the E-chuck, the electrode positioned in a plasma chamber must be sufficiently isolated from the plasma. In a typical E-chuck positioned in a high density plasma, the electrode has a voltage applied to it with respect to a ground reference point. The wafer is referenced back to the same ground reference by the plasma. The effective voltage for the electrostatic clamping of the wafer is then the voltage which appears across the E-chuck dielectric layer between the isolated electrode and the wafer. The voltage applied to the isolated electrode may be positive or negative with respect to the chamber ground. However, the electrostatic force depends on the algebraic difference between the wafer and the isolated electrode.

When the gaps around an E-chuck exceed several debye lengths, plasma may either be generated in the gaps or may be extracted into the gaps. When the plasma contacts the electrostatic chuck which has an imperfect dielectric layer or the E-chuck electrode, a current may flow between the E-chuck and the plasma. The voltage at the E-chuck electrode is therefore affected. Typically, the magnitude of the E-chuck voltage is reduced when a current flows between the chuck and the plasma which leads to a reduction in the electrostatic force. The efficiency of the E-chuck for holding a wafer is therefore affected. Ideally, the solution to the problem is to shield the E-chuck from the high density plasma by limiting gaps between the E-chuck and a shadow ring around the E-chuck to less than several debye lengths. In such an ideal situation, plasma can be prevented from being generated in the gaps or being extracted into the gaps. Since the ideal equipment conditions cannot be achieved in a manufacturing environment, the generation of plasma in the gaps or the extraction of plasma into the gaps and therefore attacking a shadow ring which is normally fabricated of quartz cannot be avoided. In a normal fabrication environment, it has been found that a quartz shadow ring would only survive about one preventive maintenance cycle or about 2,000 wafers. The corrosion occurred on the surface of the quartz shadow ring is usually severe enough that it must be replaced during a preventive maintenance procedure.

Referring initially to FIG. 1, wherein a conventional etch chamber 10 which is equipped with a shadow ring 12 installed around an electrostatic chuck 16 is shown. The etch chamber 10 is equipped with a coil antenna 14 as a plasma source in a reaction chamber 20 formed by a silicon ceiling block 22, a dome-shaped sidewall 24, a chamber wall liner 26 and the electrostatic chuck 16. The dome-shaped sidewall 24 and the chamber wall liner 26 are normally fabricated of quartz. The chamber wall liner 26 may be equipped with an opening for the passage of a wafer paddle in loading and unloading wafers. It may be removed from the vacuum chamber 10 for cleaning.

The shadow ring 12 is positioned inside the plasma reaction chamber 20 which can be lifted up to a process position by positioning pins 32. The positioning pins 32 lift the shadow ring 12 away from the wafer when a wafer is being loaded or unloaded. A multiplicity of cooling gas channels 34 is provided inside the electrostatic chuck 16 at near its top surface 36. A high heat conductivity gas such as helium can be circulated through the cooling gas channels 34 to provide a suitable gas pressure on the bottom side of wafer 30 for transferring heat away from the wafer to the water-cooled E-chuck 16 during an etch process. The supply lines for the cooling gas to channel 34 are not shown. The electrostatic chuck 16 is aligned by an electrostatic chuck collar 38. The etching gas is fed into chamber 20 through gas inlet 28. A thermal coupler 42 is mounted in the silicon ceiling block 22 for controlling temperature.

U.S. Pat. No. 6,022,809, issued to Fan, and assigned to the common assignee of the present invention, discloses a composite shadow ring that has a body portion of a ring shape made of a material substantially of silicon oxide and an insert portion which is intimately jointed to the body portion and is concentric with the body portion. The composite shadow ring 12 is further shown in FIGS. 1 and 1A. As shown in a detailed view in FIG. 1A, the shadow ring 12 is constructed by two major parts of a body portion 18 and an insert portion 48. The body portion has a ring shape and is made of a material that is substantially of silicon oxide, while the insert portion is intimately joined to the body portion 18 by frictional engagement and is juxtaposed to a plasma cloud formed in the etch chamber when the shadow ring 12 is positioned around wafer 30. The insert ring 48 has a diameter that is smaller than a diameter of the body portion 18 and is fabricated of a material that does not generate oxygen upon bombardment by a plasma, particularly by a fluorine-containing plasma. The insert ring 48 is engaged to the body portion 18 by frictional engagement or by any other mechanical means. U.S. Pat. No. 6,022,809 is hereby incorporated by reference in its entirety.

In still another improved design of composite shadow ring, shown in FIGS. 2 and 2A, the composite shadow ring 50, shown in a cross-sectional view in FIG. 2 and in a plane view in FIG. 2A, is constructed by an upper ring 54 and a lower ring 56. The advantage of this configuration of two flat, concentric rings assembled together by locating pins 60 is that only the upper ring 54 is exposed to the plasma ions in the etch chamber and therefore, only the upper ring 54 is subjected to the etching effect of the plasma. As a result, only the upper ring 54 needs to be replaced after repeated usage of the composite shadow ring 50. For instance, a commercially available composite shadow ring 50 is constructed by an upper ring 54 fabricated of silicon and a lower ring 56 fabricated of silicon dioxide.

While the composite shadow ring 50 shown in FIG. 2 presents the benefit that only the upper ring 54 is subjected to plasma corrosion and therefore only the upper ring 54 needs to be replaced, it presents a processing problem in that the lower ring 56 is difficult to clean during a preventive maintenance procedure. The locating pins 60 which are formed of quartz material integrally with or inserted into the lower ring 56 are frequently subjected to breakage during the cleaning procedure. When one or more of the locating pins 60 break off from the lower ring 56, the lower ring can no longer engage the upper ring 54 and must be scrapped. Broken locating pins 60 therefore leads to the complete replacement of the composite shadow ring 50.

It is therefore an object of the present invention to provide a composite shadow ring that is constructed of an upper ring and a lower ring that does not have the drawbacks or shortcomings of the conventional composite shadow ring.

It is another object of the present invention to provide a composite shadow ring wherein the likelihood of damaging the ring during a preventive maintenance cleaning procedure is reduced.

It is a further object of the present invention to provide a composite shadow ring that is constructed of an upper ring and a lower ring each equipped with a plurality of apertures.

It is another further object of the present invention to provide a composite shadow ring that is constructed of an upper ring and a lower ring which are assembled together by a plurality of dowel pins inserted into apertures provided in the upper and lower rings.

It is still another object of the present invention to provide a composite shadow ring that is constructed of an upper ring and a lower ring assembled together by a plurality of reinforced plastic pins engaging apertures in the upper and lower rings.

SUMMARY OF THE INVENTION

In accordance with the present invention, a composite shadow ring that is constructed of an upper and a lower ring assembled together with dowel pins and a method for using the ring are provided.

In a preferred embodiment, a composite shadow ring is provided which includes a first ring that has a first outside diameter, a planar top surface and a planar bottom surface parallel to the planar top surface, the planar bottom surface has at least two blind holes therein; a second ring that has a second outside diameter substantially similar to the first outside diameter, a planar top surface and a planar bottom surface parallel to the planar top surface, the planar top surface has at least two blind holes therein positioned in mirror image to the two blind holes in the planar bottom surface of the first ring; and at least two dowel pins connecting the first and second rings together by frictionally engaging the at least two blind holes in the first ring and the at least two blind holes in the second ring with the bottom planar surface of the first ring abutting the top planar surface of the second ring.

In the composite shadow ring, the first ring and the second ring are fabricated of different materials, or the first ring is fabricated of silicon and the second ring is fabricated of silicon oxide. The composite shadow ring may further include an insert ring situated inside and abutting an inside peripheral surface of the first and second ring. The at least two dowel pins may be four dowel pins, and may be formed in cylindrical shape. The at least two dowel pins may be formed in cylindrical shape having an outside diameter that is not more than 0.2 mm smaller than an inside diameter of the at least two blind holes in the first and second ring. The at least two dowel pins may also be formed in a dual-diameter cylinder, or the at least two dowel pins may be each formed integrally by a top cylinder of smaller diameter and a bottom cylinder of larger diameter. The at least two dowel pins may be formed of injection molded plastic, or may be formed of fiber reinforced plastic.

The present invention is further directed to an etch chamber for processing semiconductor wafers that includes means for generating a gas plasma of an etchant gas; means for holding a wafer securely on a wafer platform; and a shadow ring for engaging an edge portion of the wafer and for forming a seal between an upper chamber and a lower chamber separated by the wafer, the shadow ring includes a first ring that has a first outside diameter, a planar top surface and a planar bottom surface parallel to the planar top surface, the planar bottom surface has at least two blind holes therein; a second ring that has a second outside diameter substantially similar to the first outside diameter, a planar top surface and a planar bottom surface parallel to the planar top surface, the planar top surface may have at least two blind holes therein; and at least two dowel pins connecting the first and second ring together by frictionally engaging the at least two blind holes in the first ring and the two blind holes in the second ring with the bottom planar surface of the first ring abutting the top planar surface of the second ring.

In the etch chamber for processing semiconductor wafers, the gas plasma may be a fluorine-containing plasma for forming via holes in oxide layers. The means for holding a wafer securely on a wafer platform may be an electrostatic chucking device. The first ring may be formed substantially of silicon, while the second ring may be formed substantially of quartz.

The present invention is still further directed to a method for conducting an etch process in a plasma etch chamber that is equipped with a shadow ring including the operating steps of first providing a plasma generator for generating a plasma in the chamber; then positioning a wafer on an electrostatic chuck; sealing the edge of the wafer with a shadow ring such that an upper chamber and a lower chamber are substantially isolated from each other, the shadow ring may include a first ring that has a first outside diameter, a planar top surface and a planar bottom surface parallel to the planar top surface, the planar bottom surface may have at least two blind holes therein; a second ring that has a second outside diameter substantially similar to the first outside diameter, a planar top surface and a planar bottom surface parallel to the planar top surface, the planar top surface may have at least two blind holes therein; and at least two dowel pins connecting the first and second rings together by frictionally engaging the at least two blind holes in the first ring and the at least two blind holes in the second ring with the bottom planar surface of the first ring abutting the top planar surface of the second ring.

In the method for conducting an etch process in a plasma etch chamber that is equipped with a shadow ring, the first ring may be fabricated of silicon and the second ring may be fabricated of quartz. The at least two dowel pins may be fabricated of fiber reinforced plastic. The method may further include the step of generating a fluorine-coating plasma in the chamber for etching via holes in oxide layers.

BRIEF DESCRIPTION OF THE DRAWINGS

These and other objects, features and advantages of the present invention will become apparent from the following detailed description and the appended drawings in which.

DETAILED DESCRIPTION OF THE PREFERRED AND ALTERNATE EMBODIMENTS

The present invention discloses a composite shadow ring constructed of an upper ring and a lower ring assembled together with dowel pins.

The concentric upper and lower rings each has a predetermined outside diameter that is substantially the same, a planar top surface and a planer bottom surface parallel to the planar top surface. The planar bottom surface of the upper ring is provided with at least two blind holes, and preferably with at least three blind holes therein. The planar top surface of the lower ring is provided with at least two blind holes therein, and preferably at least three blind holes therein. At least two dowel pins, and preferably at least three dowel pins are used to connect the upper ring and the lower ring together by frictionally engaging the at least two blind holes in the upper ring and the at least two blind holes in the lower ring such that the bottom surface of the upper ring abutting the top surface of the lower ring when the shadow ring is assembled together.

The invention further discloses a plasma etch chamber for processing semiconductor wafers that includes means for generating a gas plasma of an etchant gas and supplying the plasma to the etch chamber; electrostatic chucking means for holding a wafer securely on a wafer chuck; and a composite shadow ring for engaging an edge portion of the wafer and for forming a seal between an upper chamber cavity and a lower chamber cavity separated by the wafer. The composite shadow ring is the same as that described above.

The invention still further discloses a method for conducting an etch process in a plasma etch chamber that is equipped with a shadow ring. The method can be carried out by first providing a plasma generator for generating a plasma in the chamber; then positioning a wafer on an electrostatic chuck; then sealing the edge of the wafer with a shadow ring such that an upper chamber cavity and a lower chamber cavity are substantially isolated from each other. The composite shadow ring utilized is the same as that substantially described above.

Figure 3:
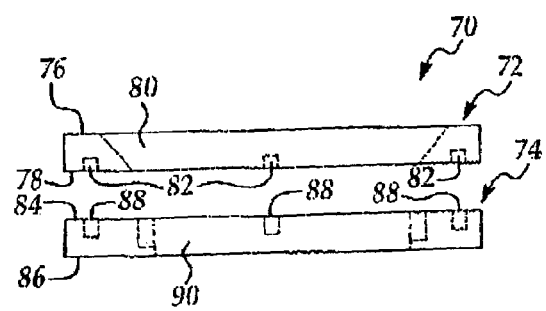
FIG. 3 is a cross-sectional view of the present invention composite shadow ring equipped with apertures in both the upper ring and the lower ring.

Referring now to FIG. 3, wherein a present invention composite shadow ring 70 is shown. The composite shadow ring 70 is constructed of an upper ring 72 and a lower ring 74. The upper ring 72 and the lower ring 74 have substantially the same outside diameter. The word "substantially" used in this writing indicates a range of value that is ±5% of the value given. The upper ring 72 has a top planar surface 76 and a bottom planar surface 78 which is substantially parallel to the top planar surface 76. An opening 80 is formed in the upper ring 72 to expose a wafer contained therein. In the planar bottom surface 78, a plurality, i.e. four, apertures 82 are provided.

Similarly, the lower ring 74 has a planar top surface 84, a bottom planar surface 86 which is parallel to the top planar surface 84. A plurality of apertures 88 are provided in the top planar surface 84 and positioned in mirror image to the apertures 82 in the bottom planar surface 78 of the upper ring 72. The lower ring 74 further includes an opening 90 for exposing a wafer when the composite shadow ring 70 is installed around a wafer (not shown).

Figure 3A:
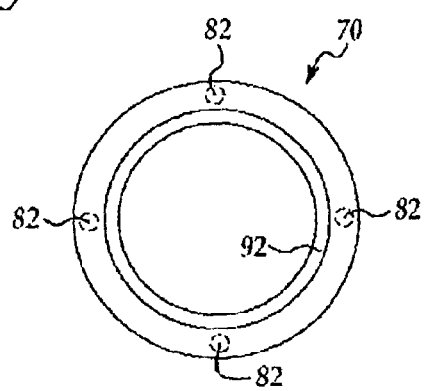
FIG. 3A is a plane view of the present invention composite shadow ring of FIG. 3.
Figure 3B:
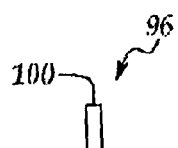
FIG. 3B is a cross-sectional view of the dowel pin used in assembling the upper ring and the lower ring of FIG. 3.

A plane view of the present invention composite shadow ring 70 is shown in FIG. 3A. It is to be noted that an insert ring 92 is also shown in FIG. 3A which has an outer diameter substantially the same as the inner diameter of the shadow ring 70. The insert ring 92 fits inside the shadow ring 70 for supporting a wafer on top.

Figure 3C:
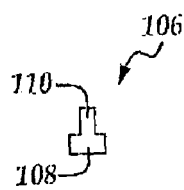
FIG. 3C is a cross-sectional view of an alternate embodiment of the dowel pin used in assembling the upper ring and the lower ring of FIG. 3.

An alternate embodiment of the present invention dowel pin 106 is shown in FIG. 3C. In this embodiment, the dowel pin 106 may have an upper portion 110 which has a smaller diameter than a lower portion 108 which has a larger diameter. Consequently, the aperture 88 provided in the bottom planar surface 78 of the upper ring 72 is also smaller than the aperture 88 in the top planar surface 84 of the lower ring 74. The alternate embodiment of the dowel pin 106 provides the additional benefit of easier identification of the upper ring 72 and the lower ring 74 when the two rings are assembled together. Since the dowel pins 96,106 can be molded by an injection molding process of a fiber reinforced plastic material, any suitable diameter of the dowel pin can be designed. A suitable fiber reinforced plastic material may be a glass fiber or mineral fiber reinforced nylon material such as one supplied by Dupont under the trade name of Vespel.

Figure 1:
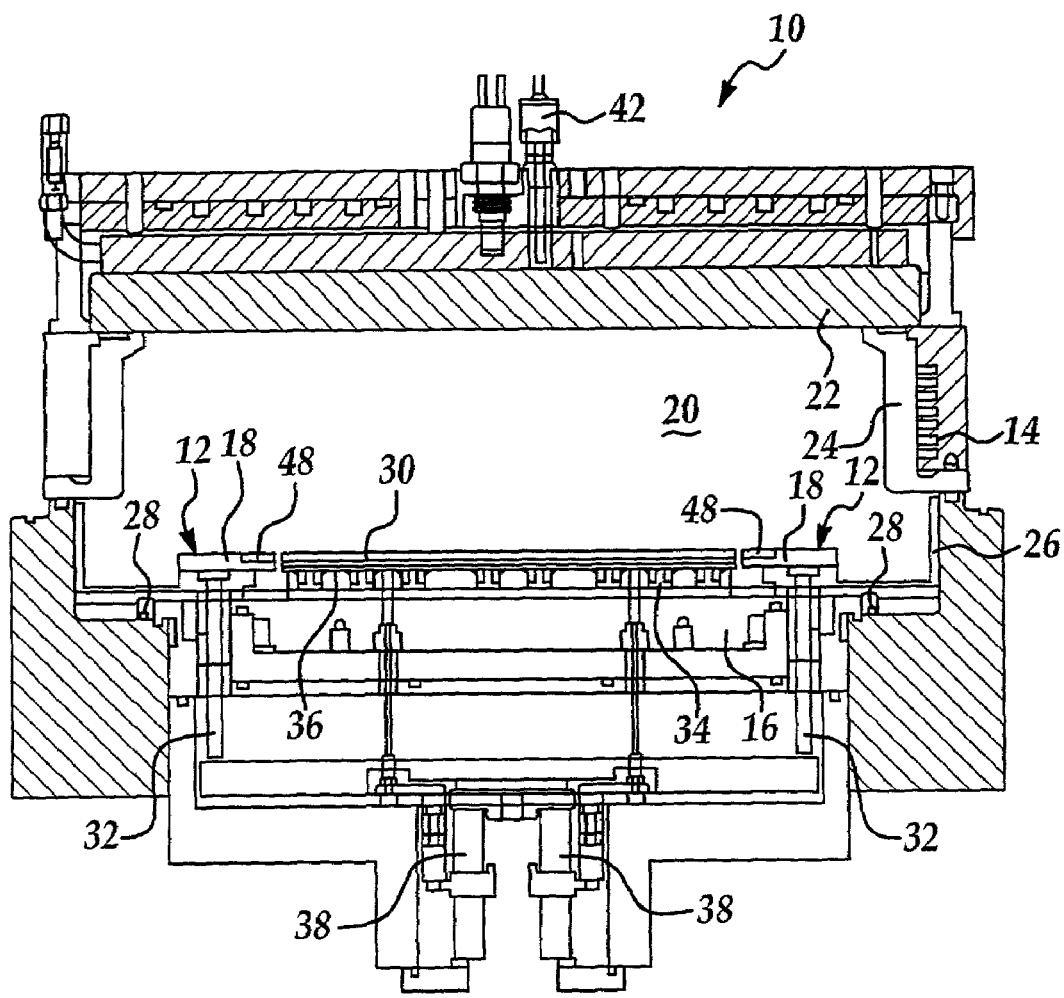
FIG. 1 is a cross-sectional view of a conventional plasma etch chamber equipped with a composite shadow ring.
Figure 1A:
FIG. 1A is a cross-sectional view of the composite shadow ring in the conventional plasma etch chamber of FIG. 1.
Figure 2:
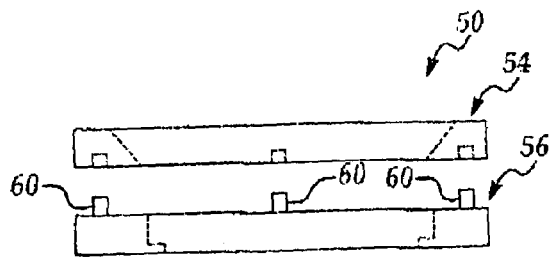
FIG. 2 is a cross-sectional view of another conventional composite shadow ring equipped with locating pins.
Figure 2A:
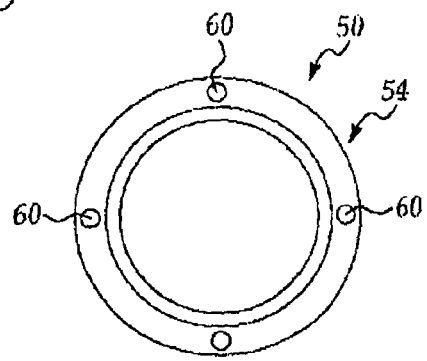
FIG. 2A is a plane view of the composite shadow ring of FIG. 2.

The present invention composite shadow ring 70 eliminates the problem caused by broken locating pins that are integrally formed with one of the upper or lower rings. Moreover, the cleaning of the shadow ring during a preventive maintenance procedure can be more easily carried out. It is also noted that without the integrally formed locating pins, shown in FIG. 2, the upper ring and the lower ring can be fabricated at lower cost. The injection molding process used to fabricate the dowel pins produces very low cost dowel pins.

The present invention composite shadow ring that is constructed by an upper ring and a lower ring assembled together by a plurality of dowel pins and a method for using the composite shadow ring have therefore been amply described in the above description and in the appended drawings of FIGS. 3, 3A-3C.

While the present invention has been described in an illustrative manner, it should be understood that the terminology used is intended to be in a nature of words of description rather than of limitation.

Furthermore, while the present invention has been described in terms of a preferred and an alternate embodiment, it is to be appreciated that those skilled in the art will readily apply these teachings to other possible variations of the inventions.

The embodiment of the invention in which an exclusive property or privilege is claimed are defined as follows.

What is claimed is:

1. A composite shadow ring comprising:
   a first ring having a first outside diameter, a planar top surface and a planar bottom surface parallel to the planar top surface, said planar bottom surface having at least two blind holes therein;
   a second ring having a second outside diameter substantially similar to said first outside diameter, a planar top surface and a planar bottom surface parallel to said planar top surface, said planar top surface having at least two blind holes therein; and
   at least two dowel pins connecting said first and second ring together by frictionally engaging said at least two blind holes in said first ring and said at least two blind holes in said second ring with said bottom planar surface of the first ring abutting said top planar surface of the second, ring wherein said at least two dowel pins are each formed of injection molded plastic.

2. A composite shadow ring according to claim 1, wherein said first ring and said second ring are fabricated of different materials.

3. A composite shadow ring according to claim 1, wherein said first ring is fabricated of silicon and said second ring is fabricated of silicon oxide.

4. A composite shadow ring according to claim 1 further comprising an insert ring situated inside and abutting an inside peripheral surface of said first end second ring.

5. A composite shadow ring according to claim 1, wherein said at least two dowel pins are four dowel pins.

6. A composite shadow ring according to claim 1, wherein said at least two dowel pins are formed in cylindrical shape.

7. A composite shadow ring according to claim 1, wherein said at least two dowel pins are formed in cylindrical shape having an outside diameter that is not more than 0.2 mm smaller than an inside diameter of said at least two blind holes in said first and second ring.

8. A composite shadow ring according to claim 1, wherein said at least two dowel pins are each formed in a dual-diameter cylinder.

9. A composite shadow ring according to claim 1, wherein said at least two dowel pins are each formed integrally of a top cylinder of smaller diameter and a bottom cylinder of larger diameter.

10. A composite shadow ring according to claim 1, wherein said at least two dowel pins are each formed of fiber reinforced plastic.

\* \* \* \* \*